(12) United States Patent
Okamoto et al.

(10) Patent No.: US 10,249,694 B2
(45) Date of Patent: Apr. 2, 2019

(54) ORGANIC EL DISPLAY DEVICE

(71) Applicant: Sharp Kabushiki Kaisha, Sakai, Osaka (JP)

(72) Inventors: Tetsuya Okamoto, Sakai (JP); Takeshi Hirase, Sakai (JP); Tohru Senoo, Sakai (JP); Tohru Sonoda, Sakai (JP); Mamoru Ishida, Sakai (JP)

(73) Assignee: SHARP KABUSHIKI KAISHA, Sakai (JP)

( * ) Notice: Subject to any disclaimer, the term of this patent is extended or adjusted under 35 U.S.C. 154(b) by 10 days.

(21) Appl. No.: 15/566,225

(22) PCT Filed: Apr. 8, 2016

(86) PCT No.: PCT/JP2016/001962
§ 371 (c)(1),
(2) Date: Oct. 13, 2017

(87) PCT Pub. No.: WO2016/166958
PCT Pub. Date: Oct. 20, 2016

(65) Prior Publication Data
US 2018/0097046 A1    Apr. 5, 2018

(30) Foreign Application Priority Data

Apr. 15, 2015    (JP) .................... 2015-083437

(51) Int. Cl.
*H01L 27/32* (2006.01)
*H05B 33/04* (2006.01)
(Continued)

(52) U.S. Cl.
CPC ...... *H01L 27/3244* (2013.01); *H01L 51/0097* (2013.01); *H01L 51/5016* (2013.01);
(Continued)

(58) Field of Classification Search
CPC ... H01L 51/50; H01L 51/5016; H01L 51/524; H01L 51/5256; H01L 27/3244; H01L 27/3262; H01L 27/3276
See application file for complete search history.

(56) References Cited

U.S. PATENT DOCUMENTS

2002/0024096 A1    2/2002    Yamazaki et al.
2003/0189403 A1*   10/2003   Yamada .............. C23C 16/403
                                                        313/511
(Continued)

FOREIGN PATENT DOCUMENTS

JP    2002-151253 A    5/2002
JP    2007-317671 A   12/2007
(Continued)

OTHER PUBLICATIONS

Official Communication issued in International Patent Application No. PCT/JP2016/001962, dated Jul. 12, 2016.

*Primary Examiner* — Thanh Y Tran
(74) *Attorney, Agent, or Firm* — Keating & Bennett, LLP (57) ABSTRACT

Disclosed is an organic EL display device which includes: a first resin substrate 10a; a basecoat film 11a provided on the first resin substrate 10a; an organic EL element 18 provided over the basecoat film 11a, a first sealing film 19 covering the organic EL element 18; a second resin substrate 10b facing the first resin substrate 10a, and provided closer to the first sealing film 19 with an adhesive layer 21 interposed between the second resin substrate 10b and the first sealing film 19; and a second sealing film 23a provided outside the first sealing film 19 and enhancing adhesion between the basecoat film 11a and a stack including the first sealing film 19 and the adhesive layer 21.

4 Claims, 7 Drawing Sheets

(51) Int. Cl.
*H01L 51/50* (2006.01)
*H01L 51/52* (2006.01)
*H01L 51/00* (2006.01)

(52) U.S. Cl.
CPC ........ *H01L 51/524* (2013.01); *H01L 51/5246* (2013.01); *H01L 51/5253* (2013.01); *H05B 33/04* (2013.01)

(56) References Cited

U.S. PATENT DOCUMENTS

2010/0308335 A1   12/2010  Kim et al.
2014/0353637 A1*  12/2014  Kawata ............... H01L 27/3272
                                                            257/40
2015/0207098 A1    7/2015  Yasuda
2016/0043340 A1*   2/2016  Ohara ................. H01L 51/5253
                                                            257/40

FOREIGN PATENT DOCUMENTS

| JP | 2008-277270 A | 11/2008 |
| JP | 2013-254747 A | 12/2013 |
| WO | 2006/046679 A1 | 5/2006 |
| WO | 2014/034051 A1 | 3/2014 |

\* cited by examiner

ORGANIC EL DISPLAY DEVICE

TECHNICAL FIELD

The present invention relates to an organic EL display device.

BACKGROUND ART

In recent years, self-luminous organic EL display devices including an organic electroluminescence (EL) element have received attention, as display devices alternative to liquid crystal display devices.

For example, Patent Document 1 discloses an organic electroluminescence display device (organic EL display device) including a display panel which includes an organic electroluminescence element (organic EL element) provided on a flexible substrate, and which has protective films bonded to its front and back surfaces with an adhesive.

CITATION LIST

Patent Documents

Patent Document 1: Japanese Unexamined Patent Publication No. 2013-254747

SUMMARY OF THE INVENTION

Technical Problem

The organic EL display device disclosed in Patent Document 1 described above includes a thin sealing film covering the organic EL element and other components, and a barrier film provided over the flexible substrate. The interface between the thin sealing film and the barrier film is exposed at an end face of the device. As a result, moisture or oxygen may enter the organic EL element via the exposed interface and may deteriorate the display capability of the organic EL element. Further, in the organic EL display device disclosed in Patent Document 1, if foreign matter exists on a surface of the barrier film or a surface of the organic EL element, it is likely that the foreign matter breaks through the thin sealing film to form a through hole. In such a case, moisture or oxygen may enter the organic EL element via the through hole formed in the thin sealing film, and may deteriorate the display capability of the organic EL element.

In view of the foregoing, it is therefore an object of the present invention to reduce the risk of deterioration of the display capability of an organic EL element caused by the entry of moisture or oxygen.

Solution to the Problem

To achieve the object, an organic EL display device of the present invention includes: a first resin substrate, a basecoat film provided on the first resin substrate; an organic EL element provided above the basecoat film; a first sealing film covering the organic EL element; a second resin substrate facing the first resin substrate, and provided closer to the first sealing film with an adhesive layer interposed between the second resin substrate and the first sealing film; and a second sealing film provided outside the first sealing film, and enhancing adhesion between the basecoat film and a stack including the first sealing film and the adhesive layer.

Advantages of the Invention

According to the present invention, a configuration in which the first and second sealing films protect the organic EL element can reduce the risk of deterioration of the display capability of an organic EL element caused by the entry of moisture or oxygen.

DESCRIPTION OF EMBODIMENTS

Embodiments of the present invention will now be described in detail with reference to the drawings. Note that the present invention is not limited to the following embodiments.

First Embodiment

Figure 1:
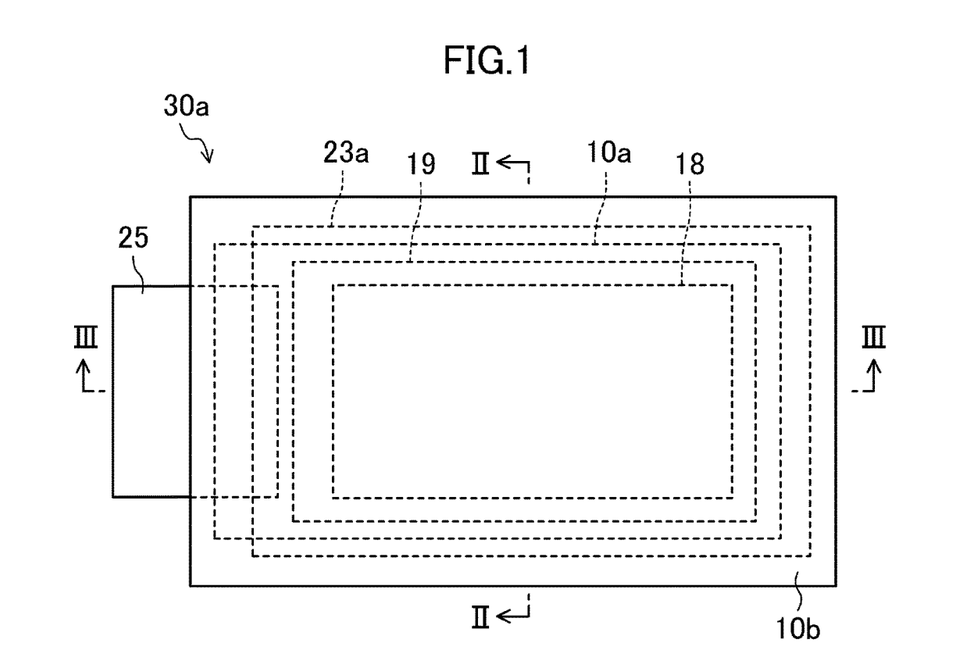
FIG. 1 is a plan view schematically showing a configuration of an organic EL display device according to a first embodiment of the present invention.
Figure 2:
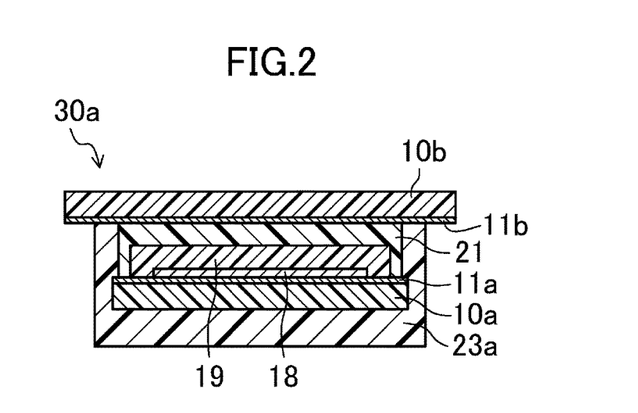
FIG. 2 is a cross-sectional view taken along the line II-II in FIG. 1, and schematically showing the configuration of the organic EL display device.
Figure 3:
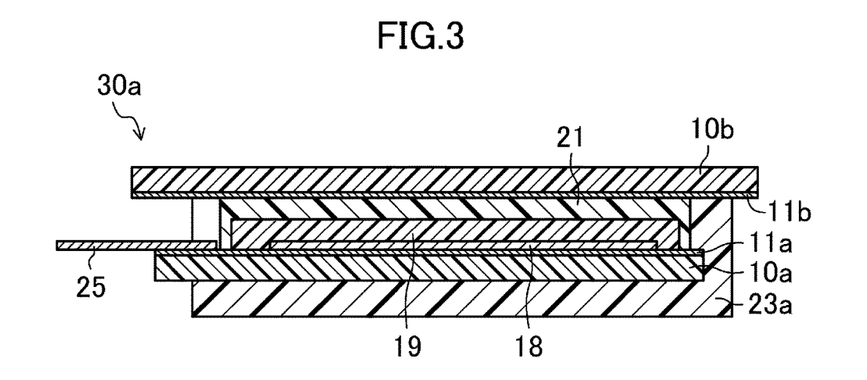
FIG. 3 is a cross-sectional view taken along the line III-III in FIG. 1, and schematically showing the configuration of the organic EL display device.
Figure 4:
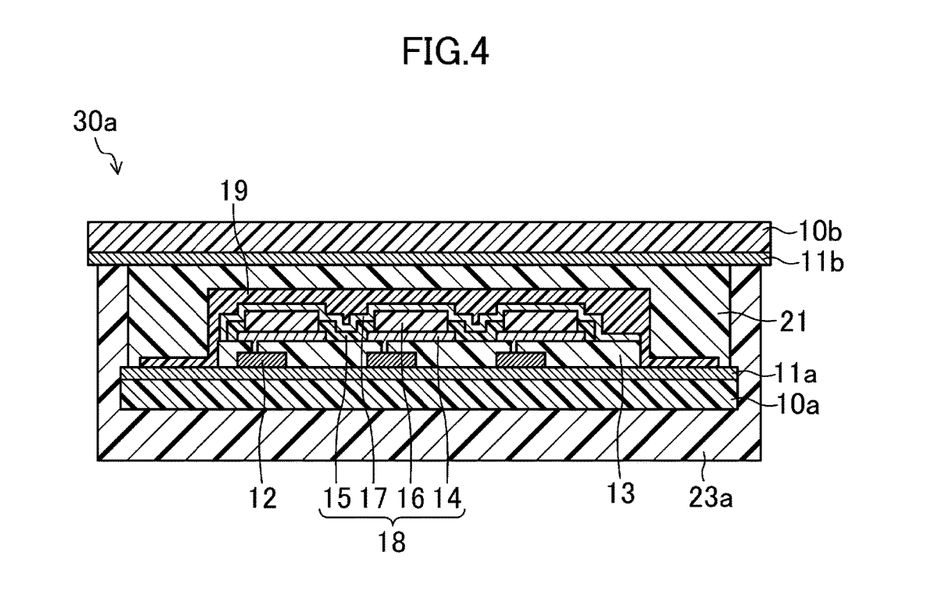
FIG. 4 is a cross-sectional view showing an internal configuration of the organic EL display device according to the first embodiment of the present invention.
Figure 5:
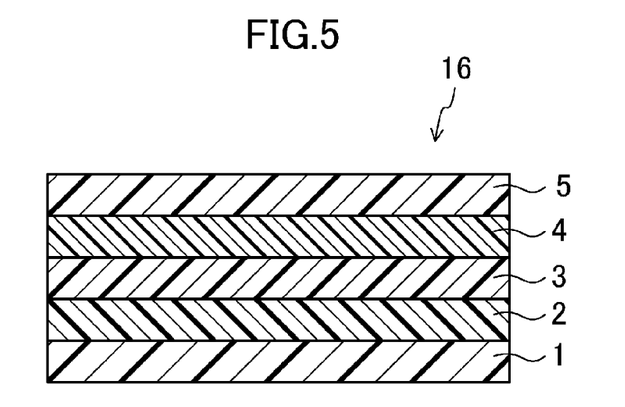
FIG. 5 is a cross-sectional view of an organic EL layer forming part of the organic EL display device according to the first embodiment of the present invention.
Figure 6:
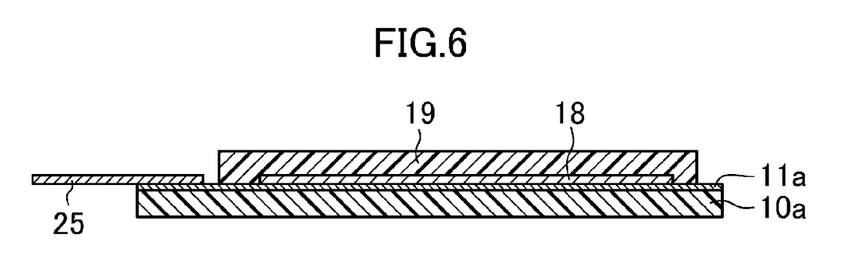
FIG. 6 is a first cross-sectional view showing a method for producing the organic EL display device according to the first embodiment of the present invention.
Figure 7:
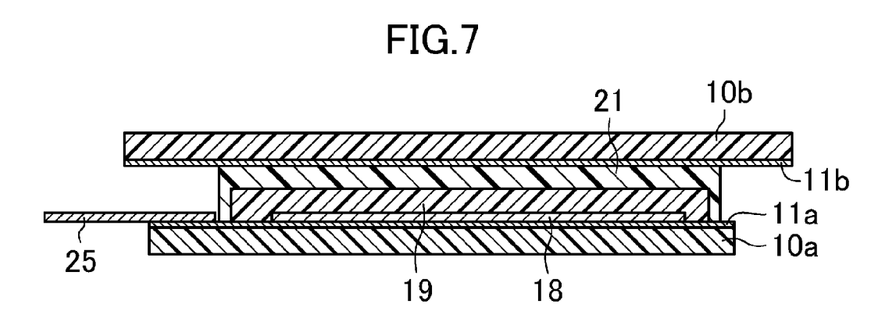
FIG. 7 is a second cross-sectional view showing the method for producing the organic EL display device according to the first embodiment of the present invention.
Figure 8:
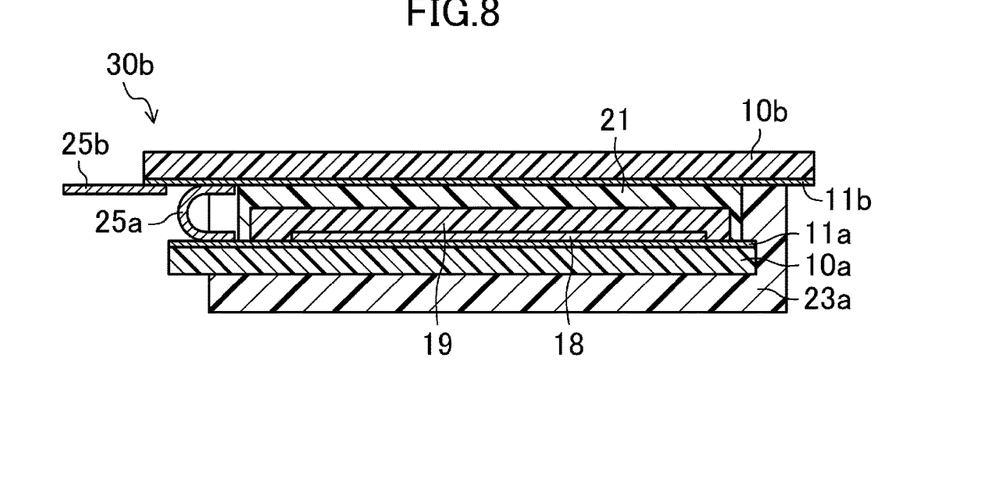
FIG. 8 is a cross-sectional view schematically showing a configuration of a variation of the organic EL display device according to the first embodiment of the present invention.

FIGS. 1-8 show an organic EL display device according to a first embodiment of the present invention. Specifically, FIG. 1 is a plan view schematically showing a configuration of the organic EL display device 30a according to this embodiment. FIG. 2 is a cross-sectional view along the short side (i.e., taken along the line II-II in FIG. 1), schematically showing the configuration of the organic EL display device 30a. FIG. 3 is a cross-sectional view along the long side (i.e., taken along the line III-III in FIG. 1), schematically showing the configuration of the organic EL display device 30a. FIG. 4 is a cross-sectional view showing an internal configuration of the organic EL display device 30a. FIG. 5 is a cross-sectional view of an organic EL layer 16 forming part of the organic EL display device 30a. FIGS. 6 and 7 are first and second cross-sectional views along the long side, showing a method for producing the organic EL display device 30a. FIG. 8 is a cross-sectional view schematically showing a configuration of an organic EL display device 30b, which is a variation of the organic EL display device 30a.

As shown in FIGS. 1-4, the organic EL display device 30a includes a first resin substrate 10a and a second resin substrate 10b which face each other, and a flexible printed circuit (FPC) 25 connected to a side portion adjoining one side of the first resin substrate 10a. Here, as shown in FIG. 1, the organic EL display device 30a includes an organic EL element 18 which will be described later. The organic EL display device 18 has a rectangular shape in a plan view, and accordingly, defines a rectangular display region where images are displayed. The display region includes a plurality of pixels arranged in a matrix. For example, each pixel includes sub-pixels arranged adjacent to each other. The sub-pixels include a sub-pixel for gradation display in red, a sub-pixel for gradation display in green, and a sub-pixel for gradation display in blue. As shown in FIGS. 1-4, in the organic EL display device 30a, the peripheral edge of the first resin substrate 10a is located inside the peripheral edge of the second resin substrate 10b.

As shown in FIGS. 2-4, a first basecoat film 11a is provided on the first resin substrate 10a and covers a surface (the upper surface in the figures) of the first resin substrate 10a.

As shown in FIGS. 2-4, the organic EL element 18 is provided over the first basecoat film 11a, with a plurality of thin film transistors (TFTs) 12 and an interlayer insulating film 13 interposed between the organic EL element 18 and the first basecoat film 11a. Electrode terminals (not shown) are provided on a portion, of the first basecoat film 11a, connected to the FPC 25 such that electric signals from the FPC 25 are inputted to the organic EL element 18 via the electrode terminals. Note that the schematic cross-sectional views of FIGS. 2 and 3 shows neither a configuration between the first basecoat film 11a and the organic EL element 18, nor an internal configuration of the organic EL element 18.

As shown in FIGS. 2-4, a first sealing film 19 is provided on the organic EL element 18 and covers a surface of the organic EL element 18.

As shown in FIGS. 2-4, a second basecoat film 11b is provided on the second resin substrate 10b and covers a surface (the lower surface in the figures) of the second resin substrate 10b.

As shown in FIGS. 2-4, an adhesive layer 21 is provided between the first sealing film 19 and the second basecoat film 11b. Here, as shown in FIGS. 2-4, the peripheral edge of the adhesive layer 21 is located inside the peripheral edge of the first resin substrate 10a.

As shown in FIGS. 2-4, a second sealing film 23a is provided over the second basecoat film 11b and covers at least a portion of each of the adhesive layer 21, the first resin substrate 10a, and the first basecoat film 11a. Specifically, the second sealing film 23a covers these components 21, 10a, and 11a, except their portions connected or adjacent to the FPC 25. The second sealing film 23a is configured to enhance adhesion between the first basecoat film 11a, and a stack including the first sealing film 19 and the adhesive layer 21, and accordingly, to enhance adhesion between the first resin substrate 10a over which the organic EL element 18 and the first sealing film 19 are formed, and the second resin substrate 10b. As shown in FIG. 3, the adhesive layer 21, the first resin substrate 10a, and the first basecoat film 11a are exposed without being covered with the second sealing film 23a near the side portion adjoining the one side, of the first resin substrate 10a, connected to the FPC 25. Further, as shown in FIG. 1, the peripheral edge of the organic EL element 18 is more distant from the peripheral edge of the first sealing film 19 in the vicinity of the side, of the first resin substrate 10a, connected to the FPC 25 than in the vicinities of the other three sides. Therefore, even though the adhesive layer 21 covering the first sealing film 19 is exposed without being covered with the second sealing film 23a, the risk of deterioration of the display capability of the organic EL element 18 caused by the entry of moisture or oxygen can be reduced.

Each of the first and second resin substrates 10a and 10b has a rectangular shape in a plan view, and is configured as a plastic substrate made of, for example, polyimide resin.

Each of the first and second basecoat films 11a and 11b is configured as an inorganic insulating film such as a silicon dioxide film or a silicon nitride film.

As shown in FIG. 4, each TFT 12 is a switching element provided on the first basecoat film 11a for a respective one of the sub-pixels. Here, each TFT 12 includes, for example: a gate electrode provided on the first basecoat film 11a; a gate insulating film covering the gate electrode; a semiconductor layer provided on the gate insulating layer and overlapping with the gate electrode; and source and drain electrodes provided on the semiconductor layer and facing each other. Note that although each TFT 12 is configured as a bottom gate TFT as an example in this embodiment, each TFT 12 may be configured as a top gate TFT.

As shown in FIG. 4, the interlayer insulating film 13 covers each TFT 12, except a portion of the drain electrode of the TFT 12. Here, the interlayer insulating film 13 is made of, for example, a transparent organic resin material such as acrylic resin.

As shown in FIG. 4, the organic EL element 18 includes a plurality of first electrodes 14, an edge cover 15, a plurality of organic EL layers 16, and a second electrode 17 which are sequentially provided over the interlayer insulating film 13. As shown in FIGS. 1 and 3, the organic EL element 18 is located close to a side of the first resin substrate 10a (i.e., the right side in FIG. 1) which is opposite to the side connected to the FPC 25.

As shown in FIG. 4, the plurality of first electrodes 14 are arranged in a matrix on the interlayer insulating film 13 such that each first electrode 14 corresponds to a respective one of the plurality of sub-pixels. Here, as shown in FIG. 4, the first electrodes 14 are connected to the drain electrodes of the TFTs 12 via contact holes formed in the interlayer insulating film 13. The first electrodes 14 have the function of injecting holes (positive holes) into the organic EL layers 16. To increase the efficiency in injecting positive holes into the organic EL layers 16, the first electrodes 14 are beneficially made of a material having a high work function. Examples of materials for the first electrodes 14 include, but are not limited to, metal materials such as silver (Ag), aluminum (Al), vanadium (V), cobalt (Co), nickel (Ni), tungsten (W), gold (Au), calcium (Ca), titanium (Ti), yttrium (Y), sodium (Na), ruthenium (Ru), manganese (Mn), indium (In), magnesium (Mg), lithium (Li), ytterbium (Yb), and lithium fluoride (LiF). The first electrodes 14 may also be made of an alloy of, for example, magnesium (Mg)/copper (Cu), magnesium (Mg)/silver (Ag), sodium (Na)/potassium (K), astatine (At)/astatine dioxide ($AtO_2$), lithium (Li)/aluminum (Al), lithium (Li)/calcium (Ca)/aluminum (Al), or lithium fluoride (LiF)/calcium (Ca)/aluminum (Al). The material for the first electrodes 14 may also be a conductive oxide such as tin oxide (SnO), zinc oxide (ZnO), indium tin oxide (ITO), and indium zinc oxide (IZO), for example. Moreover, the first electrodes 14 may be multilayers containing the above materials. Examples of materials having a high work function include, but are not limited to, indium tin oxide (ITO) and indium zinc oxide (IZO).

As shown in FIG. 4, the edge cover 15 is formed in a grid pattern to cover a peripheral portion of each first electrode 14. Examples of materials for the edge cover 15 include, but are not limited to, an inorganic film of silicon dioxide ($SiO_2$), silicon nitride ($SiN_x$, where x is a positive number) such as $Si_3N_4$, or silicon oxynitride (SiNO), and an organic film of polyimide resin, acrylic resin, polysiloxane resin, or novolak resin.

As shown in FIG. 4, the plurality of organic EL layers 16 are each provided on a respective one of the first electrodes 14, and are arranged in a matrix so as to correspond to the plurality of sub-pixels. Here, as shown in FIG. 5, each organic EL layer 16 includes a positive hole injection layer 1, a positive hole transport layer 2, a light-emitting layer 3, an electron transport layer 4, and an electron injection layer 5, which are sequentially provided over the associated first electrode 14.

The positive hole injection layer 1 is also called an anode buffer layer, and has the function of causing the energy levels of the first electrodes 14 and the organic EL layers 16 to approach each other and increasing the efficiency at which the first electrodes 14 inject positive holes into the organic EL layers 16. Here, examples of materials for the positive hole injection layer 1 include, but are not limited to, triazole derivatives, oxadiazole derivatives, imidazole derivatives, polyarylalkane derivatives, pyrazoline derivatives, phenylenediamine derivatives, oxazole derivatives, styrylanthracene derivatives, fluorenone derivatives, hydrazone derivatives, and stilbene derivatives.

The positive hole transport layer 2 has the function of increasing the efficiency at which positive holes are transported from the first electrodes 14 to the organic EL layers 16. Here, examples of materials for the positive hole transport layer 2 include, but are not limited to, porphyrin derivatives, aromatic tertiary amine compounds, styryl amine derivatives, polyvinylcarbazole, poly-p-phenylene vinylene, polysilane, triazole derivatives, oxadiazole derivatives, imidazole derivatives, polyarylalkane derivatives, pyrazoline derivatives, pyrazolone derivatives, phenylenediamine derivatives, arylamine derivatives, amine-substituted chalcone derivatives, oxazole derivatives, styrylanthracene derivatives, fluorenone derivatives, hydrazone derivatives, stilbene derivatives, hydrogenated amorphous silicon, hydrogenated amorphous silicon carbide, zinc sulfide, and zinc selenide.

When a voltage is applied from the first electrodes 14 and the second electrode 17, positive holes and electrons are injected from the first and second electrodes 14 and 17 into the light-emitting layer 3, in which the positive holes and the electrons are recombined with each other. The light-emitting layer 3 is made of a material having high luminous efficiency. Examples of materials for the light-emitting layer 3 include, but are not limited to, metal oxinoid compounds (8-hydroxyquinoline metal complexes), naphthalene derivatives, anthracene derivatives, diphenylethylene derivatives, vinylacetone derivatives, triphenylamine derivatives, butadiene derivatives, coumarin derivatives, benzoxazole derivatives, oxadiazole derivatives, oxazole derivatives, benzimidazole derivatives, thiadiazole derivatives, benzothiazole derivatives, styryl derivatives, styrylamine derivatives, bis(styryl)benzene derivatives, tris(styryl)benzene derivatives, perylene derivatives, perinone derivatives, aminopyrene derivatives, pyridine derivatives, rodamine derivatives, acridine derivatives, phenoxazone, quinacridone derivatives, rubrene, poly-p-phenylene vinylene, and polysilane.

The electron transport layer 4 functions to efficiently move electrons to the light-emitting layer 3. Here, examples of materials for the electron transport layer 4 include, but are not limited to, as organic compounds, oxadiazole derivatives, triazole derivatives, benzoquinone derivatives, naphthoquinone derivatives, anthraquinone derivatives, tetracyanoanthraquinodimethan derivatives, diphenoquinone derivatives, fluorenone derivatives, silole derivatives, and metal oxinoid compounds.

The electron injection layer 5 has the function of causing the energy levels of the second electrode 17 and the organic EL layers 16 to approach each other and increasing the efficiency at which electrons are injected from the second electrode 17 into the organic EL layers 16. This function contributes to reduction of the drive voltage of the organic EL element 18. The electron injection layer 5 may also be called a cathode buffer layer. Here, examples of materials for the electron injection layer 5 include, but are not limited to, inorganic alkaline compounds such as lithium fluoride (LiF), magnesium fluoride ($MgF_2$), calcium fluoride ($CaF_2$), strontium fluoride ($SrF_2$), and barium fluoride ($BaF_2$), aluminum oxide ($Al_2O_3$), and strontium oxide (SrO).

As shown in FIG. 4, the second electrode 17 covers the organic EL layers 16 and the edge cover 15. The second electrode 17 has the function of injecting electrons into the organic EL layers 16. To increase the efficiency in injecting electrons into the organic EL layers 16, the second electrode 17 is beneficially made of a material having a low work function. Here, examples of materials for the second electrode 17 include, but are not limited to, silver (Ag), aluminum (Al), vanadium (V), cobalt (Co), nickel (Ni), tungsten (W), gold (Au), calcium (Ca), titanium (Ti), yttrium (Y), sodium (Na), ruthenium (Ru), manganese (Mn), indium (In), magnesium (Mg), lithium (Li), ytterbium (Yb), or lithium fluoride (LiF). The second electrode 17 may also be made of an alloy of magnesium (Mg)/copper (Cu), magnesium (Mg)/silver (Ag), sodium (Na)/potassium (K), astatine (At)/astatine dioxide ($AtO_2$), lithium (Li)/aluminum (Al), lithium (Li)/calcium (Ca)/aluminum (Al), and lithium fluoride (LiF)/calcium (Ca)/aluminum (Al). The second electrode 17 may also contain a conductive oxide such as tin oxide (SnO), zinc oxide (ZnO), indium tin oxide (ITO), or indium zinc oxide (IZO). Moreover, the second electrode 17 may be multilayers containing the above materials. Examples of material having a low work function include, but are not limited to, magnesium (Mg), lithium (Li), lithium fluoride (LiF), magnesium (Mg)/copper (Cu), magnesium (Mg)/silver (Ag), sodium (Na)/potassium (K), lithium (Li)/aluminum (Al), lithium (Li)/calcium (Ca)/aluminum (Al), and lithium fluoride (LiF)/calcium (Ca)/aluminum (Al).

The first and second sealing films 19 and 23a have the function of protecting the organic EL element 18 against moisture and oxygen. Here, examples of materials for the first and second sealing film 19 and 23a include, but are not limited to, inorganic materials such as silicon dioxide ($SiO_2$), aluminum oxide ($Al_2O_3$), silicon nitride ($SiN_x$, where x is a positive number) such as $Si_3N_2$, silicon carbonitride (SiCN), silicon oxynitride (SiON), and organic materials such as acrylate, polyurea, parylene, polyimide, and polyamide.

The adhesive layer 21 is made of, for example, an acrylic, epoxy-based, or silicon-based thermosetting or UV curable adhesive.

The organic EL display device 30a having the configuration described above is flexible, and configured to display images by appropriately causing, via the TFTs 12, the light-emitting layers 3, which are included in the organic EL layers 16 and correspond to the respective sub-pixels, to emit light.

In this embodiment, the organic EL display device 30a including the first resin substrate 10a of which the side portion adjoining to the one side is connected to the FPC 25 has been exemplified. However, an organic EL display device 30b shown in FIG. 8 is also conceivable. The organic EL display device 30b includes a first FPC 25a connecting one side portion of the first resin substrate 10a to one side portion of the second resin substrate 10b, and a second FPC 25b connected to the one side portion of the second resin substrate 10b. Here, electrode terminals (not shown) for inputting electric signals from the second FPC 25b to the organic EL element 18 are provided on each of the first and second resin substrates 10a and 10b. The organic display device 30a is wire-connectable to an external device via the FPC 25. The organic display device 30b is wire-connectable to an external device via the FPCs 25a and 25b. However, this is merely an example. The organic EL display devices 30a and 30b may be configured to be wirelessly connectable to an external device via, for example, a wireless communication chip, a charger, or a wireless charging chip arranged inside the second sealing film 23a.

It is now described, with reference to FIGS. 6 and 7, a method for producing the organic EL display device 30a of this embodiment.

For example, a silicon nitride film is first formed, at a thickness of about 1 μm, on a surface of a first resin substrate 10a having a thickness of about 12 μm and made of polyimide resin, using the plasma chemical vapor deposition (CVD), thereby forming a first basecoat film 11a.

Next, TFTs 12, an interlayer insulating film 13, and an organic EL element 18 (including first electrodes 14, an edge cover 15, organic EL layers 16 (including a positive hole injection layer 1, a positive hole transport layer 2, a light-emitting layer 3, an electron transport layer 4, and an electron injection layer 5), and a second electrode 17) are formed on a surface of the first basecoat film 11a by a known method. Thereafter, a silicon nitride film (about 500 nm thick), a silicon oxynitride film (about 500 nm thick), a silicon nitride film (about 500 nm thick), a silicon oxynitride film (about 500 nm thick), a silicon nitride film (about 500 nm thick), a silicon oxynitride film (about 500 nm thick), a silicon nitride film (about 500 nm thick) are sequentially formed by, for example, the plasma CVD, such that the resultant films together cover the organic EL element 18. In this manner, a first sealing film 19 is formed.

As shown in FIG. 6, an FPC 25 is then press-bonded to a portion, of the first basecoat film 11a, corresponding to the side portion of the first resin substrate 10a, via an anisotropic conductive film (ACF, not shown).

Further, for example, using a slit coating method, a thermosetting or UV curable adhesive is applied, at a thickness of about 5 μm to about 20 μm, to a surface of the first sealing film 19 provided over the first resin substrate 10a having the FPC 25 press-bonded thereto. Thereafter, a second resin substrate 10b of polyimide resin, which is about 12 μm thick and which has, on its surface, a second basecoat film 11b comprised of an about 1 μm thick silicon nitride film, is placed on a surface of the applied adhesive. The adhesive is then cured. In this manner, as shown in FIG. 7, an adhesive layer 21 is formed and the second resin substrate 10b is bonded to the first resin substrate 10a.

Finally, a silicon nitride film (about 500 nm thick), a silicon oxynitride film (about 500 nm thick), a silicon nitride film (about 500 nm thick), a silicon oxynitride film (about 500 nm thick), a silicon nitride film (about 500 nm thick), a silicon oxynitride film (about 500 nm thick), a silicon nitride film (about 500 nm thick) are sequentially formed on a surface of the second basecoat film 11b by, for example, the plasma CVD, such that the resultant films together cover the adhesive layer 21, the first resin substrate 10a, and the first basecoat film 11a, except portions, of these components 21, 10a, and 11a, connected or adjacent to the FPC 25. In this manner, a second sealing film 23a is formed.

In the above manner, the organic EL display device 30a of this embodiment can be produced.

As can be seen, the organic EL display devices 30a and 30b of this embodiment can provide the following advantages.

(1) The second sealing film 23a that enhances the adhesion between the first basecoat film 11a and the stack including the first sealing film 19 and the adhesive layer 21 is provided outside the first sealing film 19 covering the organic EL element 18. Consequently, the capability to seal the peripheral edge of the organic EL element 18 is enhanced, and the risk of deterioration of the display capability of the organic EL element 18 caused by the entry of moisture or oxygen can be reduced. Even if foreign matter exists on a surface of the first basecoat film 11a or a surface of the organic EL element 18, and the foreign matter forms a through hole in the first sealing film 19, the second sealing film 23a secures the capability to seal the organic EL element 18. Thus, the risk of deterioration of the display capability of the organic EL element 18 caused by the entry of moisture or oxygen can be reduced. Further, the second sealing film 23a enhances the adhesion between layers of the multilayer structure forming the organic EL display devices 30a and 30b. This contributes to an increase in the physical strength of the organic EL display devices 30a and 30b against, for example, bending and impact. Thus, the organic EL display devices 30a and 30b having high reliability can be achieved.

(2) Forming the second sealing film 23a on the surface, of the first resin substrate 10a, opposite to the first basecoat film 11a enables enhancement of the capability to seal the side, of the organic EL element 18, closer to the first resin substrate 10a in each of the organic EL display devices 30a and 30b.

(3) Forming the second basecoat film 11b on a surface of the second resin substrate 10b enables enhancement of the capability to seal the side, of the organic EL element 18, closer to the second resin substrate 10b in each of the organic EL display devices 30a and 30b.

(4) Although the adhesive layer 21, the first resin substrate 10a, and the first basecoat film 11a are exposed without being covered with the second sealing film 23a near the side portion adjoining the one side, of the first resin substrate 10a, connected to the FPC 25 or 25a, the organic EL element 18 is located closer to the opposite side of the side portion connected to FPC 25 or 25a of the first resin substrate 10a. Consequently, the peripheral edge of the organic EL element 18 is spaced apart from the side portion connected to the FPC 25 or 25a, and therefore, the risk of deterioration of the capability to seal the organic EL element 18 caused by the connection to the FPC 25 or 25a can be reduced.

(5) Since the first sealing film 19 is located closer to the side portion, of the first resin substrate 10a, connected to the FPC 25 or 25a, the peripheral edge of the organic EL element 18 is more distant from the peripheral edge of the first sealing film 19 in the vicinity of the side portion, of the first resin substrate 10a, connected to the FPC 25 or 25c than in the vicinities of the other three sides of the first resin substrate 10a. Therefore, even though the adhesive layer 21 covering the first sealing film 18 is exposed without being covered with the second sealing film 23a, the risk of deterioration of the display capability of the organic EL element 18 caused by the entry of moisture or oxygen can be reduced.

Second Embodiment

Figure 9:
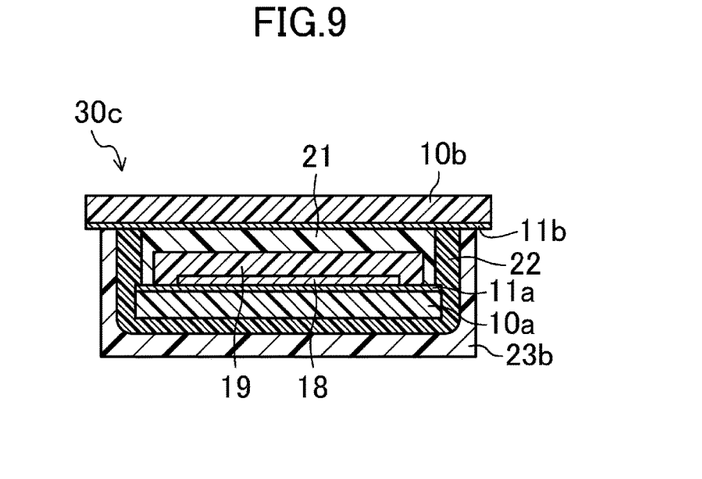
FIG. 9 is a cross-sectional view schematically showing a configuration of an organic EL display device according to a second embodiment of the present invention.
Figure 10:
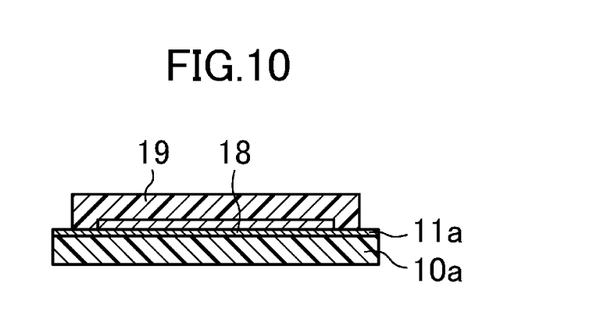
FIG. 10 is a first cross-sectional view showing a method for producing the organic EL display device according to the second embodiment of the present invention.
Figure 11:
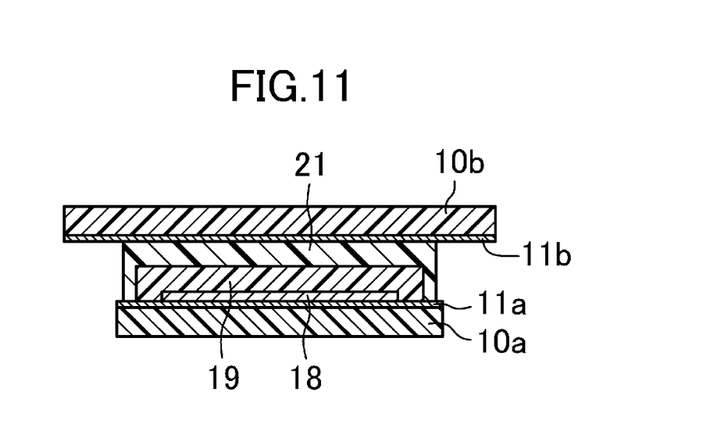
FIG. 11 is a second cross-sectional view showing the method for producing the organic EL display device according to the second embodiment of the present invention.
Figure 12:
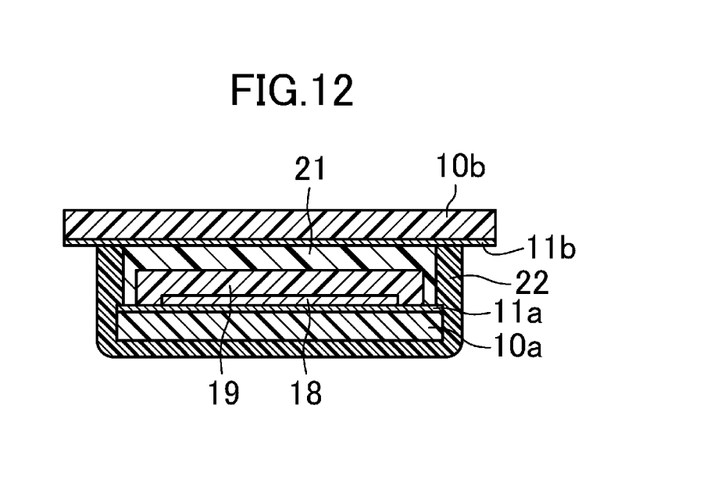
FIG. 12 is a third cross-sectional view showing the method for producing the organic EL display device according to the second embodiment of the present invention.

FIGS. 9-12 show an organic EL display device according to a second embodiment of the present invention. Specifically, FIG. 9 is a cross-sectional view along the short side, schematically showing a configuration of an organic EL display device 30c according to this embodiment. FIGS. 10, 11 and 12 are first, second, and third cross-sectional views along the short side, showing a method for producing the organic EL display device 30c. In the following embodiments, components equivalent to those shown in FIGS. 1-8 are denoted by the same reference characters, and the detailed explanation thereof will be omitted.

In the first embodiment described above, the organic EL display devices 30a and 30b including the second sealing film 23a that extends on the side surfaces of the adhesive layer 21 have been exemplified. On the other hand, the organic EL display device 30c exemplified in this embodiment includes a resin layer 22 between an adhesive layer 21 and a second sealing film 23b.

As shown in FIG. 9, the organic EL display device 30c includes a first resin substrate 10a and a second resin substrate 10b which face each other, and an FPC 25 (not shown) connected to a side portion adjoining one side of the first resin substrate 10a. Here, the organic EL display device 30c includes an organic EL element 18. The organic EL element 18 has a rectangular shape in a plan view, and accordingly, defines a rectangular display region where images are displayed. The display region includes a plurality of pixels arranged in a matrix. For example, each pixel includes sub-pixels arranged adjacent to each other. The sub-pixels include a sub-pixel for gradation display in red, a sub-pixel for gradation display in green, and a sub-pixel for gradation display in blue. As shown in FIG. 9, in the organic EL display device 30c, the peripheral edge of the first resin substrate 10a is located inside the peripheral edge of the second resin substrate 10b.

As shown in FIG. 9, a first basecoat film 11a is provided on the first resin substrate 10a and covers a surface (the upper surface in the figures) of the first resin substrate 10a.

As shown in FIG. 9, the organic EL element 18 is provided over the first basecoat film 11a with a plurality of TFTs 12 (see FIG. 4) and an interlayer insulating film 13 (see FIG. 4) interposed between the organic EL element 18 and the first basecoat film 11a.

As shown in FIG. 9, a first sealing film 19 is provided on the organic EL element 18 and covers a surface of the organic EL element 18.

As shown in FIG. 9, a second basecoat film 11b is provided on the second resin substrate 10b and covers a surface (the lower surface in the figures) of the second resin substrate 10b.

As shown in FIG. 9, the adhesive layer 21 is provided between the first sealing film 19 and the second basecoat film 11b.

As shown in FIG. 9, the resin layer 22 is provided on the second basecoat film 11b and covers at least a portion of each of the adhesive layer 21, the first resin substrate 10a, and the first basecoat film 11a. Specifically, the resin layer 22 covers these components 21, 10a, and 11a, except their portions connected to the FPC 25. Here, the resin layer 22 is made of, for example, acrylic resin, and provided so as to prevent rupture of the second sealing film 23b by covering, under its substantially even surface, a step on end surfaces between the adhesive layer 21 and a stack including the first resin substrate 10a and the first basecoat film 11a.

As shown in FIG. 9, the second sealing film 23b is provided on the second basecoat film 11b so as to cover the resin layer 22. Here, the second sealing film 23b has the function of protecting the organic EL element 18 against moisture and oxygen. Examples of materials for the second sealing film 23b include, but are not limited to, inorganic materials such as silicon dioxide ($SiO_2$), aluminum oxide ($Al_2O_3$), silicon nitride ($SiN_x$, where x is a positive number) such as $Si_3N_4$, silicon carbonitride (SiCN), and silicon oxynitride (SiON), and organic materials such as acrylate, polyurea, parylene, polyimide, and polyamide.

The organic EL display device 30c having the configuration described above is flexible, and configured to display images by appropriately causing, via the TFTs 12, the light-emitting layers 3, which are included in the organic EL layers 16 and correspond to the respective sub-pixels, to emit light.

It is now described, with reference to FIGS. 10-12, a method for producing the organic EL display device 30c of this embodiment.

First, like the first embodiment described above, a first basecoat film 11a, TFTs 12, an interlayer insulating film 13, an organic EL element 18 (including first electrodes 14, an edge cover 15, an organic EL layer 16 (including a positive hole injection layer 1, a positive hole transport layer 2, a light-emitting layer 3, an electron transport layer 4, and an electron injection layer 5), and a second electrode 17) and a first sealing film 19 are formed over a surface of a first resin substrate 10a, as shown in FIG. 10. Thereafter, an FPC 25 is press-bonded to a portion, of the first basecoat film 11a, corresponding to a side portion adjoining one side of the first resin substrate 10a.

Next, for example, using the slit coating method, a thermosetting or UV curable adhesive is applied, at a thickness of about 5 µm to about 20 µm, to a surface of the first sealing film 19 provided over the first resin substrate 10a having the FPC 25 press-bonded thereto. Thereafter, a second resin substrate 10b of polyimide resin, which is about 12 µm thick and which has, on its surface, a second basecoat film 11b comprised of an about 1 µm thick silicon nitride film, is placed on a surface of the applied adhesive. The adhesive is then cured. In this manner, an adhesive layer 21 is formed and the second resin substrate 10b is bonded to the first resin substrate 10a, as shown in FIG. 11.

Further, a film of acrylic resin is formed on a surface of the second basecoat film 11b by, for example, the vapor deposition, such that the film covers the adhesive layer 21, the first resin substrate 10a, and the first basecoat film 11a except their portions connected to the FPC 25. In this manner, the resin layer 22 is formed.

Finally, a silicon nitride film (about 500 nm thick), a silicon oxynitride film (about 500 nm thick), a silicon nitride film (about 500 nm thick), a silicon oxynitride film (about 500 nm thick), a silicon nitride film (about 500 nm thick), a silicon oxynitride film (about 500 nm thick), and a silicon nitride film (about 500 nm thick) are sequentially formed on the surface of the second basecoat film 11b by, for example, the plasma CVD, such that the resultant films together cover the resin layer 22. In this manner, a second sealing film 23b is formed.

In the above manner, the organic EL display device 30c of this embodiment can be produced.

As can be seen, the organic EL display device 30c of this embodiment can provide the following advantage (6), in addition to the advantages (1)-(5) described above.

The advantage (1) is detailed here. The second sealing film 23b that enhances the adhesion between the first basecoat film 11a and the stack including the first sealing film 19 and the adhesive layer 21 is provided outside the first sealing film 19 covering the organic EL element 18. Consequently, the capability to seal the peripheral edge of the organic EL element 18 is enhanced, and the risk of deterioration of the display capability of the organic EL element 18 caused by the entry of moisture or oxygen can be reduced. Further, even if foreign matter exists on a surface of the first basecoat film 10a or a surface of the organic EL element 18, and the foreign matter forms a through hole in the first sealing film 19, the second sealing film 23b secures the capability to seal the organic EL element 18. Thus, the risk of deterioration of the display capability of the organic EL element 18 caused by the entry of moisture or oxygen can be reduced. Furthermore, the second sealing film 23b and the resin layer 22 enhance the adhesion between layers of the multilayer structure forming the organic EL display device 30c. This contributes to an increase in the physical strength of the organic EL display devices 30c against, for example, bending and impact. Thus, the organic EL display device 30c having high reliability can be achieved.

(6) The resin layer 22, which is provided between the second sealing film 23b and the stack including the adhesive layer 21, the first basecoat film 11a, and first resin substrate 10a, covers the step between the adhesive layer 21 and the stack including the first resin substrate 10a and the first basecoat film 11a under its substantially even surface. As a result, damage to the second sealing film 23b can be reduced.

Third Embodiment

Figure 13:
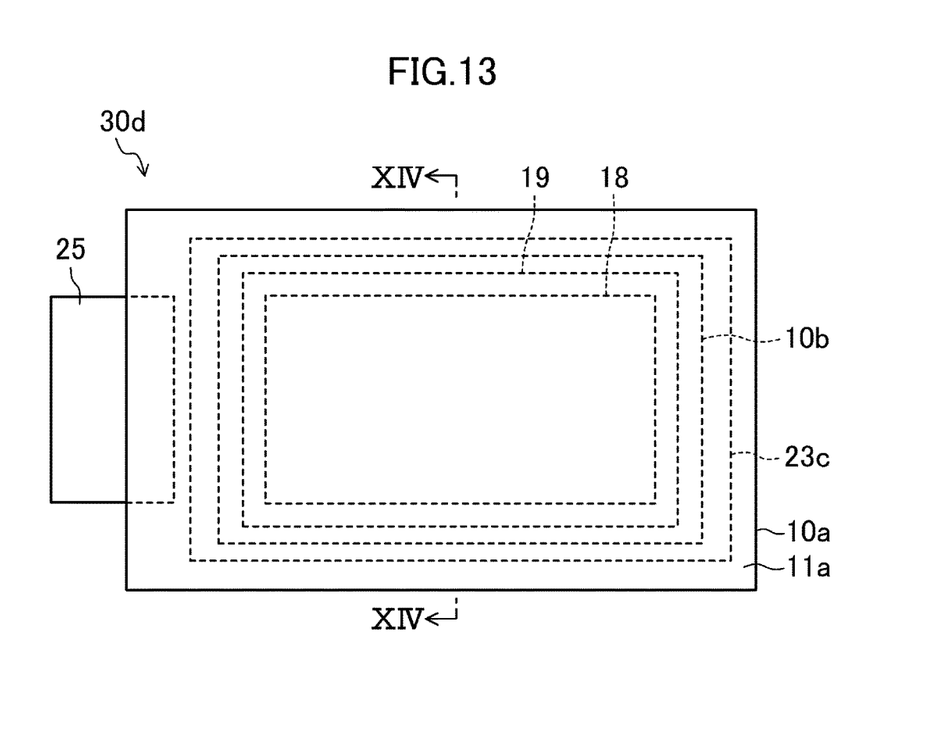
FIG. 13 is a plan view schematically showing a configuration of an organic EL display device according to a third embodiment of the present invention.
Figure 14:
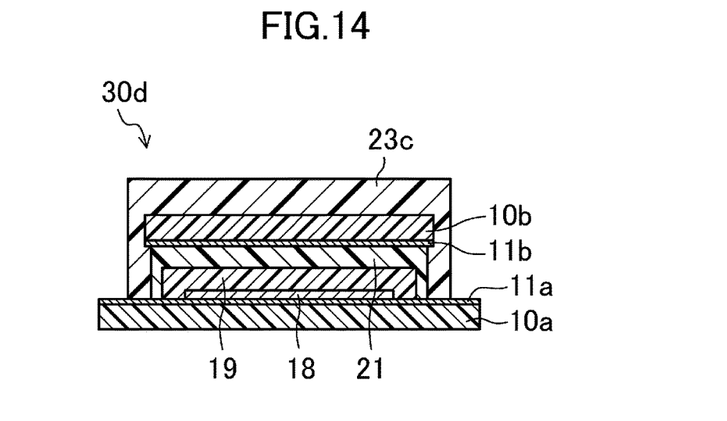
FIG. 14 is a cross-sectional view taken along the line XIV-XIV in FIG. 13, and schematically showing the configuration of the organic EL display device.
Figure 15:
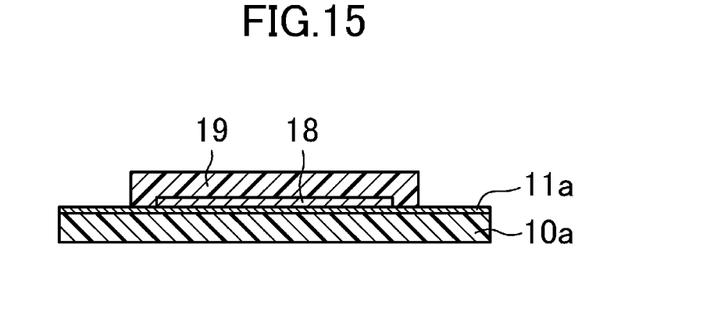
FIG. 15 is a first cross-sectional view showing a method for producing the organic EL display device according to the third embodiment of the present invention.
Figure 16:
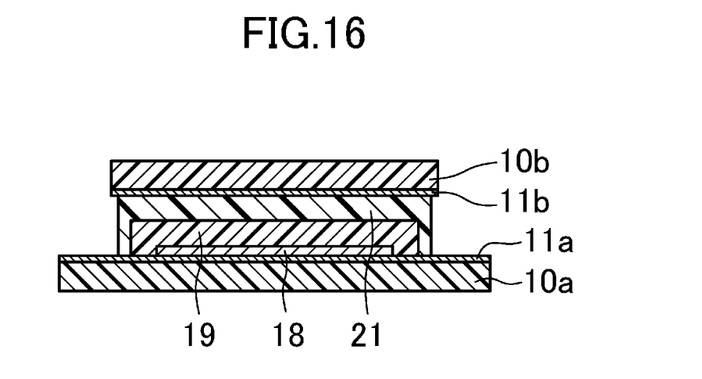
FIG. 16 is a second cross-sectional view showing the method for producing the organic EL display device according to the third embodiment of the present invention.

FIGS. 13-16 show an organic EL display device according to a third embodiment of the present invention. Specifically, FIG. 13 is a plan view schematically showing a configuration of an organic EL display device 30d of this embodiment. FIG. 14 is a cross-sectional view along the short side (i.e., taken along line XIV-XIV in FIG. 13), schematically showing a configuration of the organic EL display device 30d. FIGS. 15 and 16 are first and second cross-sectional views along the short side, showing a method for producing the organic EL display device 30d.

The organic EL display devices 30a-30c exemplified in the first and second embodiments described above are configured such that the peripheral edge of the first resin substrate 10a is located inside the peripheral edge of the second resin substrate 10b. By contrast, the organic EL display device 30d exemplified in this embodiment is configured such that the peripheral edge of a first resin substrate 10a is located outside the peripheral edge of a second resin substrate 10b.

As shown in FIGS. 13 and 14, the organic EL display device 30d includes the first resin substrate 10a and the second resin substrate 10b which face each other, and an FPC 25 connected to a side portion adjoining one side of the first resin substrate 10a. Here, as shown in FIG. 13, the organic EL display device 30d includes an organic EL element 18. The organic EL display device 18 has a rectangular shape in a plan view, and accordingly, defines a rectangular display region where images are displayed. The display region includes a plurality of pixels arranged in a matrix. For example, each pixel includes sub-pixels arranged adjacent to each other. The sub-pixels include a sub-pixel for gradation display in red, a sub-pixel for gradation display in green, and a sub-pixel for gradation display in blue. As shown in FIGS. 13 and 14, in the organic EL display device 30d, the peripheral edge of the first resin substrate 10a is located outside the peripheral edge of the second resin substrate 10b.

As shown in FIG. 14, a first basecoat film 11a is provided on the first resin substrate 10a and covers a surface (the upper surface in the figures) of the first resin substrate 10a. Note that although the configuration in which the first basecoat film 11a is provided on a surface of the first resin substrate 10a is exemplified in this embodiment, another inorganic film may be formed on the other side of the first resin substrate 10a to enhance the capability to seal the organic EL element 18.

As shown in FIG. 14, the organic EL element 18 is provided over the first basecoat film 11a with a plurality of TFTs 12 (see FIG. 4) and an interlayer insulating film 13 (see FIG. 4) interposed between the organic EL element 18 and the first basecoat film 11a.

As shown in FIG. 14, a first sealing film 19 is provided on the organic EL element 18 and covers a surface of the organic EL element 18.

As shown in FIG. 14, a second basecoat film 11b is provided on the second resin substrate 10b and covers a surface (the lower surface in the figures) of the second resin substrate 10b.

As shown in FIG. 14, an adhesive layer 21 is provided between the first sealing film 19 and the second basecoat film 11b.

As shown in FIG. 14, a second sealing film 23c is provided on the second basecoat film 11b and covers the adhesive layer 21, the second resin substrate 10b, and the second basecoat film 11b. Here, the second sealing film 23c has the function of protecting the organic EL element 18 against moisture and oxygen. Examples of materials for the second sealing film 23c include, but are not limited to, inorganic materials such as silicon dioxide ($SiO_2$), aluminum oxide ($Al_2O_3$), silicon nitride ($SiN_x$, where x is a positive number) such as $Si_3N_4$, silicon carbonitride (SiCN), and silicon oxynitride (SiON), and organic materials such as acrylate, polyurea, parylene, polyimide, and polyamide. The organic EL display device 30d exemplified in this embodiment includes the second sealing film 23c that extends on the side surfaces of the adhesive layer 21. However, like the second embodiment described above, the organic EL display device 30d may include a resin layer between the adhesive layer 21 and the second sealing film 23c such that the resin layer covers, under its substantially even surface, a step between adhesive layer 21 and the stack including the second resin substrate 10b and the second basecoat film 11b.

The organic EL display device 30d having the configuration described above is flexible, and configured to display images by appropriately causing, via the TFTs 12, the light-emitting layers 3, which are included in the organic EL layers 16 and correspond to the respective sub-pixels, to emit light.

It is now described, with reference to FIGS. 15 and 16, a method for producing the organic EL display device 30d of this embodiment.

First, like the first embodiment described above, a first basecoat film 11a, TFTs 12, an interlayer insulating film 13, an organic EL element 18 (including first electrodes 14, an edge cover 15, an organic EL layer 16 (including a positive hole injection layer 1, a positive hole transport layer 2, a light-emitting layer 3, an electron transport layer 4, and an electron injection layer 5), and a second electrode 17) and a first sealing film 19 are formed over a surface of a first resin substrate 10a, as shown in FIG. 15. Thereafter, an FPC 25 is press-bonded to a portion, of the first basecoat film 11a, corresponding to a side portion adjoining one side of the first resin substrate 10a.

Next, for example, using the slit coating method, a thermosetting or UV curable adhesive is applied, at a thickness of about 5 μm to about 20 μm, to a surface of the first sealing film 19 provided over the first resin substrate 10a having the FPC 25 press-bonded thereto. Thereafter, a second resin substrate 10b of polyimide resin, which is about 12 μm thick and which has, on its surface, a second basecoat film 11b comprised of an about 1 μm thick silicon nitride film, is placed on a surface of the applied adhesive. The adhesive is then cured. In this manner, an adhesive layer 21 is formed and the second resin substrate 10b is bonded to the first resin substrate 10a, as shown in FIG. 16.

Further, a silicon nitride film (about 500 nm thick), a silicon oxynitride film (about 500 nm thick), a silicon nitride film (about 500 nm thick), a silicon oxynitride film (about 500 nm thick), a silicon nitride film (about 500 nm thick), a silicon oxynitride film (about 500 nm thick), and a silicon nitride film (about 500 nm thick) are sequentially formed on a surface of the first basecoat film 11a by, for example, the plasma CVD, such that the resultant films together cover the resin layer 21, the second basecoat film 11b, and the second resin substrate 10b. In this manner, a second sealing film 23c is formed.

Note that according to the production method exemplified in this embodiment, the FPC 25 is press-bonded before bonding of the second resin substrate 10b. However, the press-bonding of the FPC 25 may follow the bonding of the second resin substrate 10b and the formation of the second sealing film 23c.

In the above manner, the organic EL display device 30d of this embodiment can be produced.

As can be seen, the organic EL display device 30d of this embodiment can provide the following advantage (7), in addition to the advantages (1) and (3) described above.

The advantage (1) is detailed here. The second sealing film 23c that enhances the adhesion between the first basecoat film 11a and the stack including the first sealing film 19 and the adhesive layer 21 is provided outside the first sealing film 19 covering the organic EL element 18. Consequently, the capability to seal the peripheral edge of the organic EL element 18 is enhanced, and the risk of deterioration of the display capability of the organic EL element 18 caused by the entry of moisture or oxygen can be reduced. Further, even if foreign matter exists on a surface of the first basecoat film 10a or a surface of the organic EL element 18, and the foreign matter forms a through hole in the first sealing film 19, the second sealing film 23c secures the capability to seal the organic EL element 18. Thus, the risk of the deterioration of display capability of the organic EL element 18 caused by the entry of moisture or oxygen can be reduced. Furthermore, the second sealing film 23c enhances the adhesion between layers of the multilayer structure forming the organic EL display device 30d. This contributes to an increase in the physical strength of the organic EL display devices 30d against, for example, bending and impact. Thus, the organic EL display device 30d having high reliability can be achieved.

(7) The second sealing film 23c is provided to cover the adhesive layer 21 and the second resin substrate 10b. Specifically, the second sealing film 23c surrounds the four sides of the organic EL element 18, and the FPC 25 is connected to a portion outside the second sealing film 23c. This configuration contributes to enhancement of the capability to seal the organic el element 18 even though the FPC 25 is press-bonded to the first resin substrate 10a.

Other Embodiments

In each of the above embodiments, the organic EL layer has been exemplified as a layer having a stacked structure of the five layers, namely, the positive hole injection layer, a positive hole transport layer, the light-emitting layer, the electron transport layer, and the electron injection layer. However, the organic EL layer may have a stacked structure of three layers including a positive hole injection and transport layer, a light-emitting layer, and an electron transport and injection layer, for example.

In each of the above embodiments, the organic EL display device in which the first electrode functions as the anode and the second electrode functions as the cathode has been exemplified. However, the present invention is applicable to an organic EL display device which has an inverted stacked structure of the organic EL element and in which the first electrode functions as the cathode and the second electrode functions as the anode.

In each of the above embodiments, the organic EL display device including the element substrate in which an electrode of the TFT connected to the first electrode is denoted as the drain electrode has been exemplified. However, the present invention is applicable to an organic EL display device including an element substrate in which the electrode of the TFT connected to the first electrode is called a source electrode.

The organic EL display device exemplified in each of the above embodiments is configured such that the total thickness of the upper components provided above the organic EL element differs from the total thickness of the lower components provided below the organic EL element. However, the organic EL display device may be configured such that the upper components and the lower components have a similar total thickness, and the organic EL element is accordingly located at a neutral plane to which substantially no stress is applied when the organic EL display device is curved. This configuration contributes to an increase in the flexibility of the organic EL display device.

INDUSTRIAL APPLICABILITY

As can be seen from the foregoing description, the present invention is useful for an organic EL display device.

DESCRIPTION OF REFERENCE CHARACTERS

10a First Resin Substrate
10b Second Resin Substrate
11a First Basecoat Film
11b Second Basecoat Film
18 Organic EL Element
19 First Sealing Film
21 Adhesive Layer
22 Resin Layer
23a-23c Second Sealing Film
25 Flexible Printed Circuit (FPC)
25a First Flexible Printed Circuit (First FPC)
30a-30d Organic EL Display Device

The invention claimed is:

1. An organic EL display device comprising:
a first resin substrate;
a basecoat film provided on the first resin substrate;
an organic EL element provided over the basecoat film;
a first sealing film covering the organic EL element;
a second resin substrate facing the first resin substrate, and provided closer to the first sealing film with an adhesive layer interposed between the second resin substrate and the first sealing film; and
a second sealing film provided outside the first sealing film, and enhancing adhesion between the basecoat film and a stack including the first sealing film and the adhesive layer, wherein
in a plan view, a peripheral edge of the first resin substrate is located inside a peripheral edge of the second resin substrate,
the second sealing layer covers at least a portion of each of the adhesive layer, the first resin substrate, and the basecoat film,
in the plan view, a peripheral edge of the adhesive layer is located inside the peripheral edge of the first resin substrate, and
a resin layer is provided between the second sealing film and a stack including the adhesive layer and the first resin substrate such that the resin layer covers a step between the adhesive layer and the first resin substrate.

2. The organic EL display device of claim 1, wherein
the first resin substrate has a rectangular shape in the plan view,
a flexible printed circuit is connected to a side portion adjoining one side of the first resin substrate,
the adhesive layer, the first resin substrate, and the basecoat film are exposed without being covered with the second sealing film near the side portion adjoining the one side of the first resin substrate, and
the organic EL element provided over the basecoat film is located closer to an opposite side of the one side of the first resin substrate.

3. The organic EL display device of claim 2, wherein the first sealing film is located closer to a side opposite to the one side of the first resin substrate.

4. The organic EL display device of claim 1, wherein another basecoat film is provided on a surface, of the second resin substrate, facing the adhesive layer.

* * * * *